US006621496B1

(12) United States Patent
Ryan

(10) Patent No.: US 6,621,496 B1
(45) Date of Patent: Sep. 16, 2003

(54) DUAL MODE DDR SDRAM/SGRAM

(75) Inventor: Kevin J. Ryan, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/257,683

(22) Filed: Feb. 26, 1999

(51) Int. Cl.$^7$ ................................................. G09G 5/39
(52) U.S. Cl. ........................ 345/533; 345/545; 345/534; 711/105; 365/233; 713/401
(58) Field of Search ................................. 345/530–534, 345/545, 501; 713/400, 401, 500, 503; 711/100, 105; 365/233

(56) References Cited

U.S. PATENT DOCUMENTS

| | | | | |
|---|---|---|---|---|
| 5,754,838 A | * | 5/1998 | Shibata et al. | 395/559 |
| 5,966,724 A | | 10/1999 | Ryan | 711/105 |
| 6,044,032 A | | 3/2000 | Li | 365/230.03 |
| 6,044,429 A | | 3/2000 | Ryan et al. | 710/131 |
| 6,151,271 A | * | 11/2000 | Lee | 365/233 |
| 6,397,312 B1 | * | 5/2002 | Nakano et al. | 711/105 |

OTHER PUBLICATIONS

IEEE Journal of Solid–State Circuits, vol. 33, No. 11, "64–Mbit, 640–MByte/s Bidirectional Data Strobed, DDR SDRAM with a 40–mW DLL for a 256–MByte Memory System" by C. H. Kim et al, pp. 1703–1710, Nov. 1998.*

Electronic Engineering Times, "Standards battle splits double rate SDRAM vendors" by David Lammers, Aug. 11, 1997, 3 pages.*

EDGE: Work–group Computing Report, Chips: Samsung announces it is developing SDRAM–II; SDRAM–II will succeed SDRAM for production systems in 1998–2001; details roadmap to 2.4 GB/s.* data bandwidth, Feb. 10, 1997.*

"16Mb Double Data Rate Synchronous Graphics RAM", *IBM Corporation*, IBM0616328RL6A, pp. 1–53, (Dec. 1997).

"16Mbit DDR SGRAM, 128K ×32Bit ×4 Banks Double Data Rate Synchronous Graphic RAM with Bi–directional Data Strobe", *Samsung Electronics Company*, KM432D5131, Revision 0.6, Data Sheet, pp. 1–48, (Apr. 1998).

* cited by examiner

*Primary Examiner*—Kee M. Tung
(74) *Attorney, Agent, or Firm*—Schwegman, Lundberg, Woessner & Kluth, P.A.

(57) ABSTRACT

A dual-mode dual-data rate (DDR) synchronous dynamic random access memory (SDRAM)/synchronous graphic random access memory (SGRAM). An exemplary DDR SDRAM/SGRAM comprises a single memory device, which itself comprises a memory array and a logic circuitry. The logic circuitry is coupled to the memory array and is configurable to operate the single memory device in a first mode and a second mode. The first mode may include a delayed lock loop (DLL) capability while the second mode may include a non-DLL capability.

29 Claims, 4 Drawing Sheets

DUAL MODE DDR SDRAM/SGRAM

FIELD OF THE INVENTION

This invention relates generally to dual-data rate (DDR) memories, and more particularly to dual-mode DDR synchronous dynamic random access memories (SDRAM's)/synchronous dynamic graphic random access memories (SGRAM's).

BACKGROUND OF THE INVENTION

Graphics-intensive applications for computers such as personal computers (PC's) are becoming increasingly more popular. Such applications include high-end computer-aided drafting (CAD) applications, games, real-time video applications, as well as other applications. As these applications become more complex, they require the computers on which they are run to render and execute graphics much more quickly. Furthermore, as the typical resolution of computer screens have increased from 640×480 pixels (horizontal×vertical) to 800×600, 1024×768 and beyond, and increased color information per pixel from two bits to 24 bits to 32 bits and beyond, the processing demand placed on the computers for fast graphics execution has also grown.

The typical computer relies on a graphics card (also known as a video card, graphic accelerator card, or a display adapter, among other terms) to assist it in the display of graphics on a display device. A graphics card generally includes a specialized processor or processors that are tailor-made for graphics rendering, as well as an amount of memory, ranging from one, two, four, eight, sixteen megabytes and up, so that a complete screen of graphics information, known as a frame, can be stored by the graphics card. Thus, this memory is generally known as a frame buffer of the graphics card. Graphics "cards" may also be integrated within a single chip on a motherboard of a computer. A graphics card, and potentially other components, make up the graphics subsystem of a computer.

Initially, the memory of a graphics card was standard-issue dynamic random-access memory (DRAM), of a sort also used by computer processors to hold more general information. Thus, as improvements in memory to increase their speed became available, such as the introduction of synchronous dynamic random-access memory (SDRAM), they usually have been utilized within graphics cards, too. Ultimately, however, the specialized needs of graphics rendering required their own type of memory, such as synchronous graphics random-access memory (SGRAM), which is analogous to SDRAM, but includes enhanced graphics features for use with graphics cards. The need for faster memory within graphics cards has not, however, abated.

Thus, graphics cards manufacturers have looked to new technologies, such as Rambus DRAM's (also known as Direct RDRAM's), available from Rambus, Inc. of Mountain View, Calif., to increase graphics subsystem performance. Rambus DRAM use within graphics cards, however, has been limited because it is based on a closed standard governed by Rambus, Inc., such that use of Rambus DRAM requires the payment of royalties to Rambus, Inc. Therefore, manufacturers have looked to other technologies that are based on open standards.

One such type of memory is the Double Data Rate (DDR) DRAM. The DDR DRAM achieves increased performance by providing for two data accesses within a single clock cycle—hence its name—by enabling the memory to read data on both the rising and failing edges of each clock cycle. The concept of DDR memories has been extended to SDRAM's and SGRAM's in particular, resulting in DDR SDRAM and DDR SGRAM. Such memory has witnessed increased interest on the part of graphics card designers as a manner by which increased graphics performance can be realized.

However, perhaps because DDR SDRAM and DDR SGRAM are based on an open standard, at least two different types of DDR SDRAM and SGRAM have been proposed. A first standard for DDR SDRAM/SGRAM has been championed by Intel Corp., of Santa Clara, Calif., as implemented by manufacturers such as Samsung Electronics Co., of Suwon, South Korea, in its KM432D5131 DDR SGRAM, a data sheet for which, Revision 0.6 (April 1998), is hereby incorporated by reference. A second standard has been agreed to by the members of the Joint Electronic Device Engineering Council (JEDEC), which is an industry organization that attempts to set common standards, among other things. An example of a DDR SDRAM/SGRAM according to this latter standard is the IBM DDR SGRAM IBM0616328RL6A, manufactured by International Business Machines (IBM), Inc., of White Plains, N.Y., and a data sheet for which, #06L6370-02 (12/97), is also hereby incorporated by reference.

Although both of these standards achieve increased performance over non-DDR SDRAM/SGRAM's, there are functional and timing parameter differences between the two that prevent the use of one in direct lieu of another. For example, CAS latencies, preambles, postambles, enablement/disablement of DLL, as well as set-up and hold-time parameters differ between chips of the differing types. This makes it difficult for memory manufacturers to succeed in the graphics memory marketplace, since they realistically have to produce chips according to both standards if they wish to sell DDR SDRAM/SGRAM's to all potential customers.

An alternative is to design a DDR SDRAM/SGRAM that in actuality has both types of devices on a single chip, such that either device is selectable by the appropriate modification of metal, fuses or bond options on the die. This is disadvantageous, however. Although such a memory may be marketed as being compatible with either standard, in actuality the manufacturer is putting two separate devices on a single chip, which means the manufacturer is ultimately making a chip that is more complex and thus probably more expensive than DDR SDRAM/SGRAM's that are compatible with only one standard or another. Thus, such a "dual-device" DDR SDRAM/SGRAM is realistically a cost-prohibitive solution.

There is a need, therefore, for a DDR SDRAM/SGRAM that operates in accordance with both of any two standards for such memories. Such a solution desirably does not require the use of two separate DDR SDRAM/SGRAM devices on a single chip, either of which is selectable, but rather achieves dual-standard compatibility in a different manner. That is, there is a need for a DDR SDRAM/SGRAM that is compatible with more than one standard and which can be produced in a cost-effective way.

SUMMARY OF THE INVENTION

The above-mentioned shortcomings, disadvantages and problems are addressed by the present invention, which will be understood by reading and studying the following specification. The invention relates to a dual-mode dual-data rate (DDR) synchronous dynamic random access memory (SDRAM)/synchronous graphic random access memory (SGRAM). In one embodiment, a DDR SDRAM/SGRAM comprises a single memory device, which itself comprises a memory array and a logic circuitry. The logic circuitry is coupled to the memory array and is configurable to operate the single memory device in a first mode and a second mode. In a more particular embodiment of the invention, the first mode includes a delayed lock loop (DLL) capability and the second mode includes a non-DLL capability.

Thus, the invention provides for advantages not found in the prior art. A DDR SDRAM/SGRAM according to the invention is able to operate in two modes—for instance, a DLL mode and a non-DLL mode. This means that manufacturers are able to market and sell such memory to original equipment manufacturers (OEM's) regardless of whether they use the memory in the former or the latter mode. Because the memory is a single memory device memory, the manufacturer realizes cost savings as compared to a two memory device memory, and manufacturing efficiencies as well (e.g., not having to produce two separate memories, one for each mode).

The invention includes DDR SDRAM/SGRAM's, memory devices, graphics cards, computers and methods of varying scope. Still other embodiments, advantages and aspects of the invention will be understood by reference to the drawings and by reading the detailed description.

DETAILED DESCRIPTION OF THE INVENTION

In the following detailed description of exemplary embodiments of the invention, reference is made to the accompanying drawings which form a part hereof, and in which is shown by way of illustration specific exemplary embodiments in which the invention may be practiced. These embodiments are described in sufficient detail to enable those skilled in the art to practice the invention, and it is to be understood that other embodiments may be utilized and that logical, mechanical, electrical and other changes may be made without departing from the spirit or scope of the present invention. The following detailed description is, therefore, not to be taken in a limiting sense, and the scope of the present invention is defined only by the appended claims.

Figure 1:
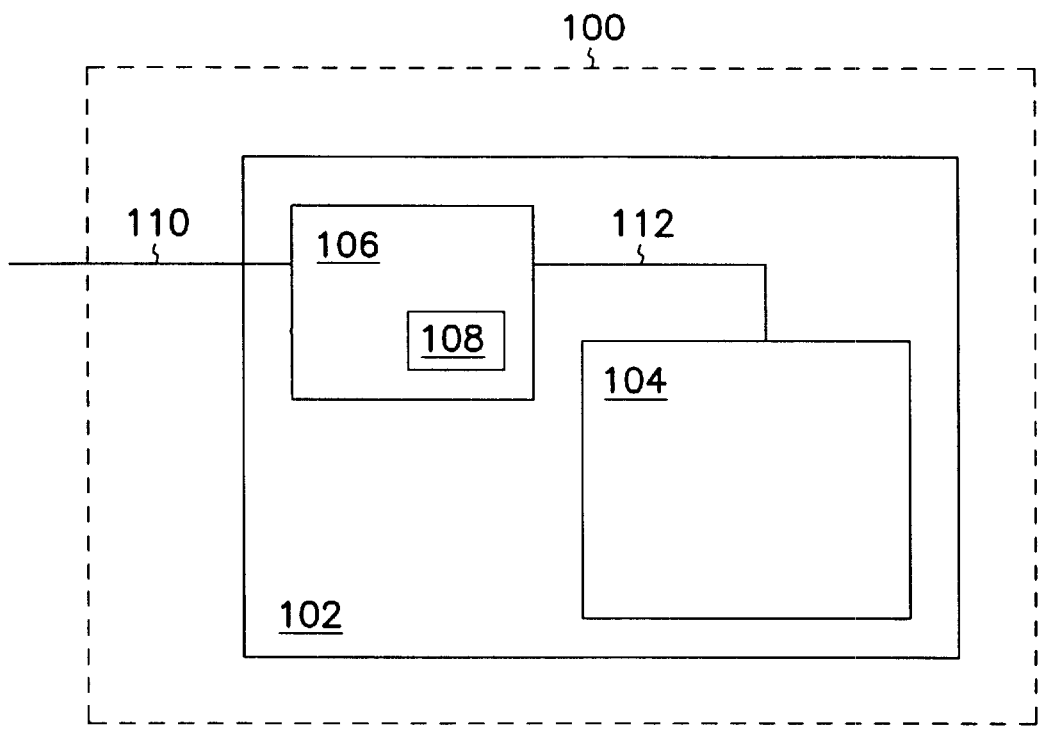
FIG. 1 a block diagram of a dual-mode DDR SDRAM/SGRAM, according to one embodiment of the invention.

The invention provides for a dual-mode dual-data rate (DDR) synchronous dynamic random access memory (SDRAM)/synchronous graphic random access memory (SGRAM). Referring first to FIG. 1, a block diagram of a dual-mode DDR SDRAM/SGRAM, according to one embodiment of the invention, is shown. DDR SDRAM/SGRAM 100 includes a single memory device 102. That is, the DDR SDRAM/SGRAM 100 does not have additional memory devices contained therein for the purposes of frame buffering for graphics processing besides the single memory device 102. Thus, the dual-mode nature of the DDR SDRAM/SGRAM 100 is based on a single memory device design, as opposed to a two or more memory device design that would be more expensive to manufacture, as described in the background section.

The single memory device 102 includes a memory array 104, a logic circuitry 106, lines 110 for external connection to the device 102, and lines 112 coupling the array 106 to the array 104. The memory cells are accessed in response to an address signal provided on address lines, not specifically shown in FIG. 1, but which can be part of lines 110 and/or lines 112 in one embodiment. The logic circuitry 106 includes an Extended Mode Register 108 in one embodiment, and other circuitry as can be appreciated by those of ordinary skill within the art, such as input/output buffers, control circuitry, address decoders, etc. Lines 110 and 112 in one embodiment can also include lines responsive to controls signals including, but not limited to, a Clock (CLK), a Row Access Strobe (RAS*), a Column Access Strobe (CAS*), a Write Enable (WE*), and a Clock Enable (CKE).

The DDR SDRAM/SGRAM 100 includes dual-mode operation via the logic circuitry 106 of the single memory device 102. The logic circuitry 106 is configurable to operate the device 102 in either a first mode or a second mode. In one embodiment, the mode of operation is controlled via the Extended Mode Register 108. That is, the logic circuitry 106 defaults to the second mode of operation for the device 102, and switches to the first mode of operation for the device 102 when a predetermined command is received at the Register 108 via one or more of the lines 110.

In one embodiment, the first mode includes a delayed lock loop (DLL) capability, as known within the art, while the second mode does not include DLL capability—that is, the second mode includes a non-DLL capability. DLL capability generally provides for the alignment of an output data on a read line of the DDR SDRAM/SGRAM 100 (e.g., one or more of the lines 110 and/or lines 112), within an incoming clock signal. In one embodiment, the loading of a Load Mode Register command into the Register 108 of the device 102 causes the logic circuitry 106 to switch operation of the device 102 to the DLL mode, from the default non-DLL mode.

The invention is not limited to modes relating to DLL, however. For example, in another embodiment of the invention, the first mode relates to phase lock loop (PLL) capability, as known within the art, while the second mode does not include PLL capability—that is, the second mode includes a non-PLL capability. PLL capability is another manner by which alignment of an output data on a read line is provided. Other such capabilities are known within the art, and are amenable to the invention.

Switching the DDR SDRAM/SGRAM 100 from the non-DLL mode to the DLL mode causes variation in several of the characteristics of the DDR SDRAM/SGRAM 100. Those of ordinary skill within the art can appreciate that the characteristics of the DDR SDRAM/SGRAM 100 in the non-DLL mode is comparable to the characteristics of single-mode DDR SDRAM/SGRAM's that operate always in a non-DLL mode, such as the Samsung DDR SDRAM/

SGRAM referenced in the background section, and that the characteristics of the DDR SDRAM/SGRAM 100 in the DLL mode are comparable to the characteristics of single-mode DDR SDRAM/SGRAM's that operate always in a DLL mode, such as the IBM DDR SDRAM/SGRAM also referenced in the background section. Such characteristics that vary in accordance with the particular mode the DDR SDRAM/SGRAM 100 is currently operating in include, but are not limited to: DLL, CAS latencies, preambles, postambles, set-up timing and hold timing, as can be understood by those of ordinary skill within the art.

Figure 2:
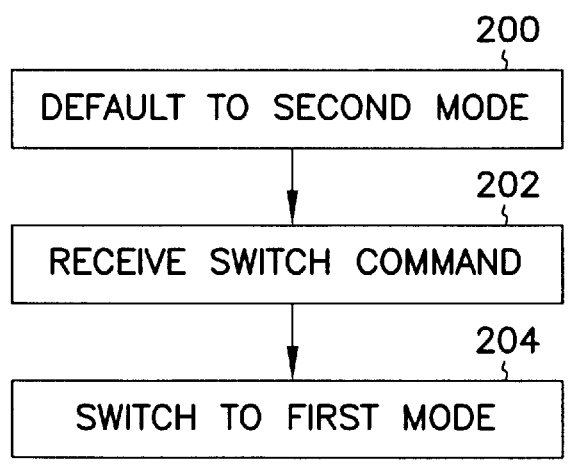
FIG. 2 is a flowchart of a method according to an embodiment of the invention.

Referring next to FIG. 2, a flowchart of a method according to an embodiment of the invention is shown. The method of FIG. 2 may be performed by a dual-mode DDR SDRAM/SGRAM according to the invention, such as the dual-mode DDR SDRAM/SGRAM as has been described in conjunction with FIG. 1. In 200, upon power-up and initialization of the dual-mode DDR SDRAM/SGRAM, the memory defaults to a second mode of operation. This second mode of operation can in one embodiment include non-DLL capability.

In 202, the memory receives a command to switch operation of the DDR SDRAM/SGRAM from the second mode to a first mode of operation. The first mode of operation can in one embodiment include DLL capability. In one embodiment, the command is a predetermined command, such as a Load Mode Register command, received on an Extended Mode Register of the memory. Finally, in 204, the memory switches from operating in the second mode to operation in the first mode, upon receiving the predetermined command.

Figure 3A:
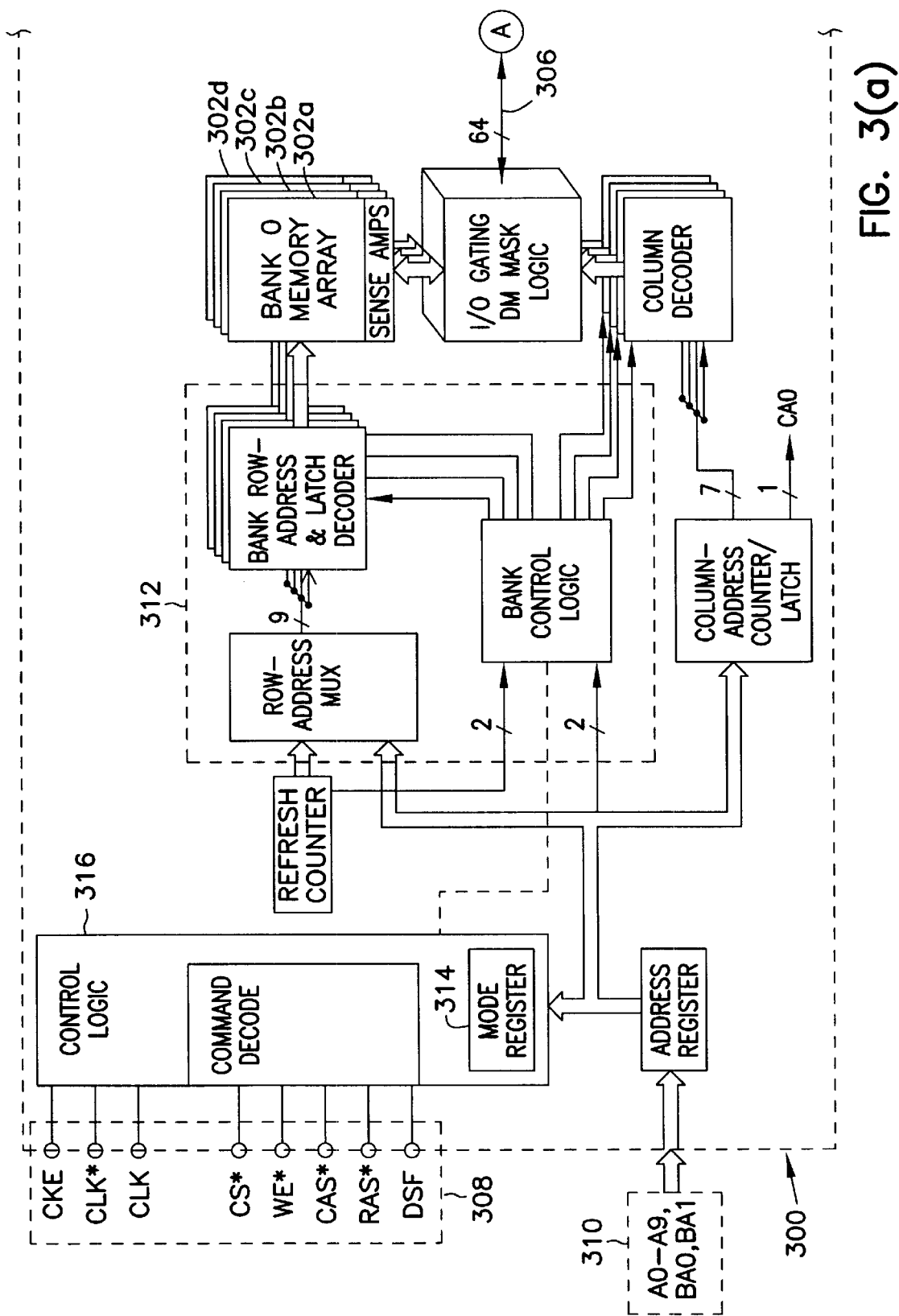
FIGS. 3(a) and 3(b) are a more detailed diagram of a dual-mode DDR SGRAM, according to one embodiment of the invention.
Figure 3B:
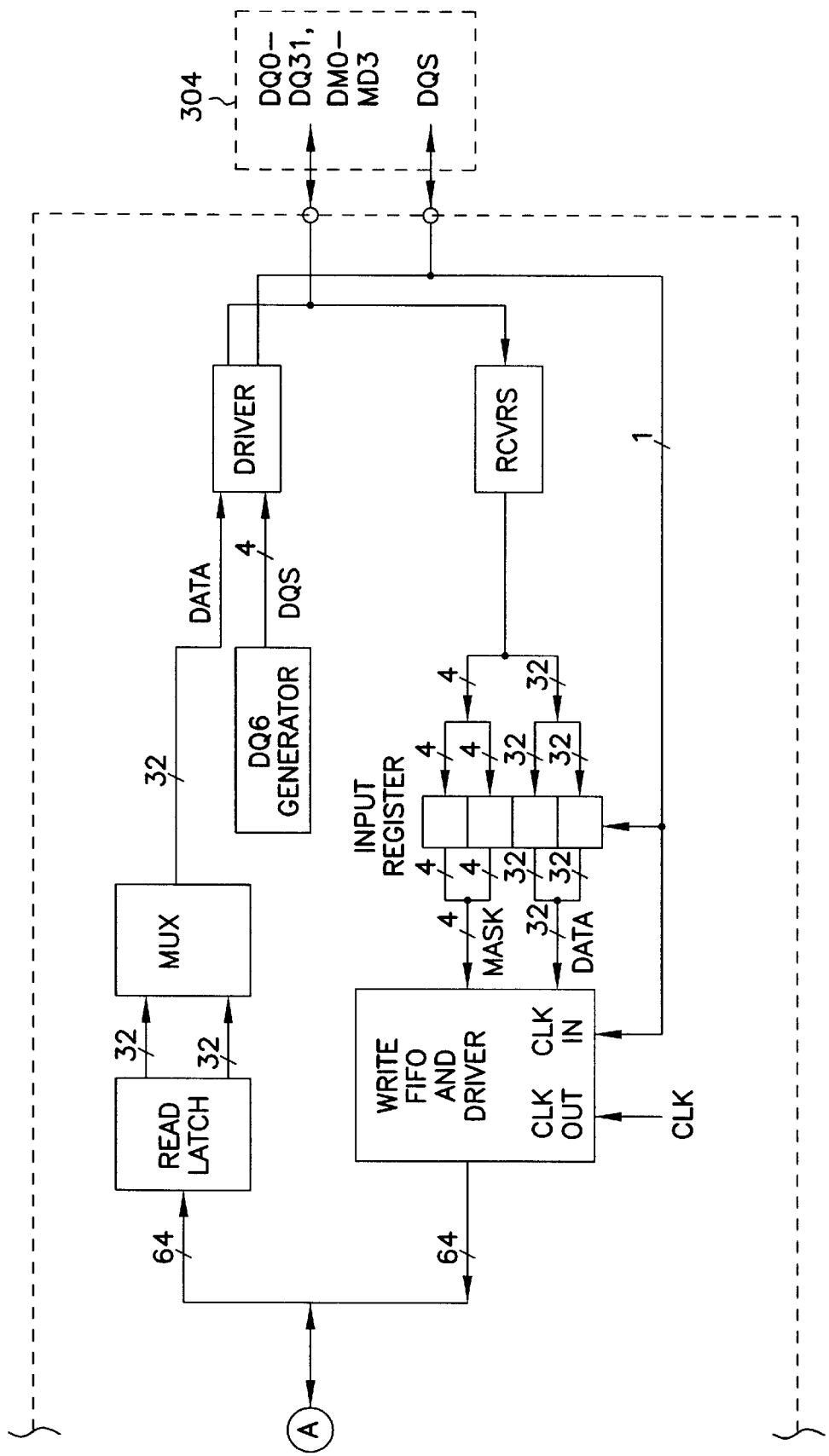

A more detailed diagram of a dual-mode DDR SGRAM, according to one embodiment of the invention, is shown in FIGS. 3(a) and 3(b). The dual-mode DDR SGRAM 300 is a sixteen megabit (Mb), high-speed Complementary Metal Oxide Semiconductor (CMOS), dynamic random-access memory containing 16,777,216 bits. It is internally configured as a quad-bank DRAM, with each 4,194,304-bit bank 302a, 302b, 302c and 302d organized as 512 rows by 256 columns by 32 bits.

The DDR SGRAM 300 uses an internal, pipelined DDR architecture to achieve high-speed operation. The DDR architecture is basically a 2n prefetch architecture with an interface to transfer two data words per clock cycle at the input/output (I/O) pins 304. A single read or write access for the SGRAM 300 consists of a single 64-bit, one-clock-cycle data transfer at the internal DRAM core at 306 and two corresponding 32-bit, one-half-clock-cycle data transfer at the I/O pins 304.

A bidirectional data strobe (DQS), part of the I/O pins 304, is transferred externally, along with data, for use in data capture at the receiver. DQS is an intermittent strobe transmitted by the SGRAM 300 during READs and by the memory controller (not shown in FIG. 3(a) nor FIG. 3(b)) during WRITEs. DQS is edge-aligned with data for READs and center-aligned with data for WRITEs.

The SGRAM 300 operates from a differential clock (CLK and CLK#, part of control pins 308; the crossing of CLK going HIGH and CLK# going LOW is referred to as the positive edge of CLK). Commands (address and control signals on control pins 308) are registered at every positive edge of CLK. Input data is registered on both edges of DQS (part of I/O pins 304), and output data is referenced to both edges of DQS as well as both edges of CLK.

Read and write accesses to the DDR SGRAM 300 are burst oriented; accesses start at a selected location and continue for a programmed number of locations in a programmed sequence. Accesses begin with the registration of an ACTIVE command, which is then followed by a READ, WRITE, or BLOCK WRITE command. The address bits registered coincident with the ACTIVE command are used to select the bank and row to be accessed (BA0, BA1 select the bank, A0–A8 select the row, at bank and row pins 310) via bank and row logic circuitry 312. The address bits registered coincident with the READ or WRITE command are used to select the starting column location for the burst access.

The SGRAM 300 provides for programmable READ or WRITE burst lengths of 2, 4, or 8 locations, or the full page. An AUTO PRECHARGE function may be enabled to provide a self-timed row precharge that is initiated at the end of the burst sequence.

As with standard SGRAM's, the SGRAM 300 has a pipelined, multibank architecture providing for concurrent operation, thereby providing high effective bandwidth by hiding row precharge and activation time.

The DDR SGRAM 300 differs from DDR SDRAM's in configuration and by providing 16-column BLOCK WRITE and full-page burst capability. That is, the quad-bank pipelined architecture combined with the additional graphics functions results in a device well suited to high-performance graphics applications or other high-bandwidth applications.

The DDR SGRAM 300 can in one embodiment be designed to operate in 2.5 volt, low-power memory systems. An auto refresh mode can be provided, along with a power-saving, power-down mode. All inputs can be compatible with the Joint Electronic Device Engineering Council (JEDEC) Standard for SSTL_2, as known within the art. All outputs can be SSTL_2, Class II compatible, as also known within the art.

The DDR SGRAM 300 defaults to a first, non-DLL mode (which is a non-JEDEC mode) upon power-up, to accommodate controllers designed for that mode of operation only. The device enters the DLL mode (which is a JEDEC mode) of operation if and when the DLL is enabled, via a Load Mode Register Command to the Extended Mode Register, part of registers 314 of control logic circuitry 316. Once in the JEDEC mode, the SGRAM 300 remains in that mode until powered down.

Figure 3C:
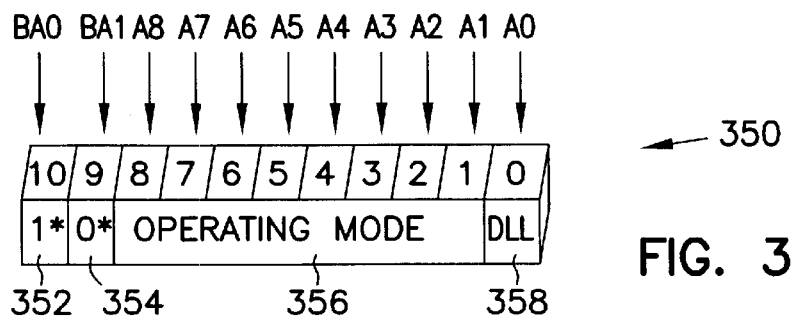
FIG. 3(c) is a diagram of the Extended Mode Register of the SGRAM of FIGS. 3(a) and 3(b), according to one embodiment of the invention.

A more detailed diagram of the Extended Mode Register of SGRAM 300 is shown in FIG. 3(c). The Extended Mode Register 350 is used to enable or disable the DLL of the SGRAM 300. The Extended Mode Register 350 is programmed via the Load Mode Register command, with bit 352 (BA0) equal to one and bit 354 (BA1) equal to zero, and retains this stored information until it is programmed again or the SGRAM loses power.

The Extended Mode Register in one embodiment must be loaded when all banks are idle, and the controller must wait a specified time before initiating a subsequent operation. Bits 356 (A1–A8) of the Register 350 specify the operating mode of the SGRAM, where all bits being zero specifying normal operation. Bit 358 is the DLL, such that when it is set to zero (via the Load Mode Register command) it is enabled and a DLL (JEDEC) mode is entered, and such that it initially defaults to one it is disabled and a non-DLL (non-JEDEC) mode is the current mode of operation.

Figure 4:
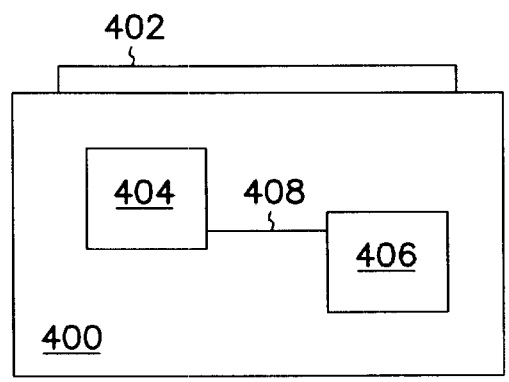
FIG. 4 is a diagram of a graphics card according to an embodiment of the invention.

A dual-mode DDR SDRAM/SGRAM in accordance with the invention may be utilized in different devices, such as a graphics (or, video) card (or, controller), and a graphics subsystem of a computer. Referring to FIG. 4, a diagram of a graphics card according to an embodiment of the invention is shown. The graphics card 400 includes an edge connector 402, a graphics processor 404, a dual-mode DDR SDRAM/ SGRAM 406, and lines 408 connecting the processor 404 to the DDR SDRAM/SGRAM 406. The edge connector 402 is not limited by the invention, and is meant to plug the card 400 into a corresponding slot of a computer of a computer, as can be appreciate by those of ordinary skill within the art. Thus, the connector 402 may be in accordance with different connector-slot standards, such as the Advanced Graphics Port (AGP), Peripheral Component Interconnect (PCI), Industry Standard Architecture (ISA), etc.

Similarly, the processor 404 is also not limited by the invention. The processor 404 provides for the display of graphics on a computer display, in response to receiving data and commands from the computer or graphics subsystem into which the card is connected and/or is a part, via the connector 402. The processor 404 utilizes the DDR SDRAM/SGRAM 406 in this regard, to, for example, store a complete frame of a video image (the DDR SDRAM/ SGRAM 406 hence acting as a frame buffer). The DDR SDRAM/SGRAM 406 is configurable to operate in a first mode and a second mode in accordance with an embodiment of the invention, and in one embodiment may be the DDR SDRAM/SGRAM of FIG. 1.

Figure 5:
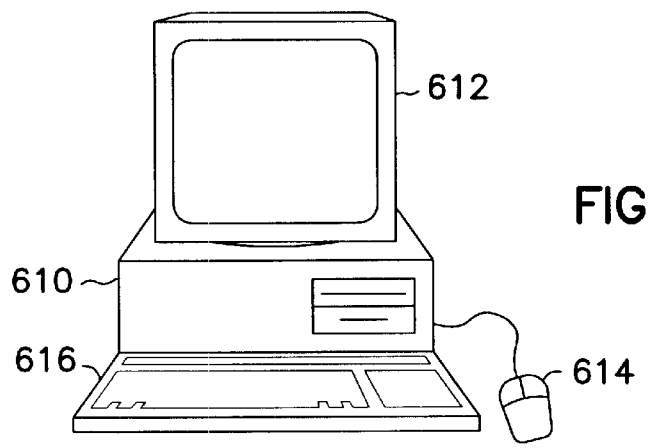
FIG. 5 is a diagram of a computer in conjunction with which embodiments of the invention may be implemented; and, FIG. 6 is a diagram of another system according to an embodiment of the invention.

Referring now to FIG. 5, a diagram of a computer in conjunction with which embodiments of the invention may be implemented is shown. Computer 610 is operatively coupled to display device 612, pointing device 614, and keyboard 616. Computer 610 includes a processor, random-access memory (RAM), read-only memory (ROM), and one or more storage devices, such as a hard disk drive, a floppy disk drive (into which a floppy disk can be inserted), an compact-disc read-only-memory (CD-ROM) player (into which a CD-ROM can be inserted), and a tape cartridge drive. The memory, hard drives, floppy disks, etc., are types of computer-readable media. Computer programs running on the computer are executed by the processor from the computer-readable media. The invention is not particularly limited to any type of computer 610.

Display device 612 permits the display of information for viewing by a user of the computer. The invention is not limited to any particular display device 612. Such display devices include cathode ray tube (CRT) displays (monitors), as well as flat panel displays such as liquid crystal displays (LCD's). The display device 612 is controlled by a graphics subsystem of the computer 610 (not shown in FIG. 6) coupled to the computer, such that the subsystem displays graphical information on the device 612. The graphics subsystem includes a dual-mode DDR SDRAM/SGRAM according to the invention, such as that of FIG. 1.

Pointing device 614 permits the control of a screen pointer provided by graphical user interfaces that may run on the computer. The invention is not limited to any particular pointing device 614. Such pointing devices include mouses, touch pads, trackballs, remote controls and point sticks. Finally, keyboard 616 permits entry of textual information into computer 610, as known within the art, and the invention is not limited to any particular type of keyboard.

Figure 6:
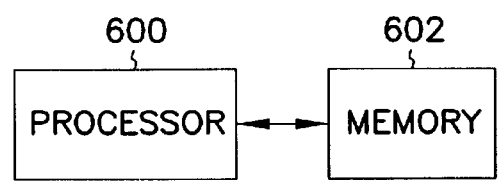

Referring finally to FIG. 6, a diagram of a system in accordance with one embodiment of the invention is shown. The system includes a processor 600, and a memory 602. The processor 600 is also not limited by the invention. The processor 600 utilizes the memory 602. The memory 602 is configurable to operate in a plurality of modes, such as a first mode and a second mode, in accordance with an embodiment of the invention, and in one embodiment may be the DDR SDRAM/SGRAM of FIG. 1.

The invention is not limited to the function or intended purpose of the system of FIG. 6. As has been described in this application, one such purpose is for graphics processing in the context of a computer. Other functions of the system include a set-top box for a television set, as well as a high-definition television (HDTV) set. The invention is not so particularly. In systems intended for these purposes, as well as systems intended for other purposes, the system may include other components besides the processor 600 and the memory 602. The other such components vary with the application, as known in the art, and as can be appreciated by those of ordinary skill within the art.

A dual-mode DDR SDRAM/SGRAM has been described. Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the present invention. Therefore, it is manifestly intended that this invention be limited only by the following claims and equivalents thereof.

I claim:

1. A dual-data rate (DDR) synchronous dynamic random access memory (SDRAM)/synchronous graphic random access memory (SGRAM) comprising a memory device comprising:

a memory array; and, a logic circuitry coupled to the memory array configurable to operate a bidirectional strobe of the memory device in a first DDR mode and a second DDR mode, the logic circuit including a Delay Locked Loop (DLL)/Phase Locked Loop (PLL) circuit to align the data with the bidirectional strobe;

wherein the first DDR mode enables the Delay Locked Loop (DLL)/Phase Locked Loop (PLL) circuit and wherein the second DDR mode disables the Delay Locked Loop (DLL)/Phase Locked Loop (PLL) circuit and allows memory input/output operation.

2. The DDR SDRAM/SGRAM of claim 1, wherein each of the first mode and the second mode further relate to a different alignment of output data as to a read line of DDR SDRAM/SGRAM.

3. The DDR SDRAM/SGRAM of claim 1, wherein the DLL/PLL circuit provides for alignment of output data of the DDR SDRAM/SGRAM with an incoming clock signal.

4. The DDR SDRAM/SGRAM of claim 1, wherein the logic circuitry defaults to the second mode, and enters the first mode upon receiving a predetermined command.

5. The DDR SDRAM/SGRAM of claim 4, wherein the predetermine command comprises a Load Mode Register command.

6. The DDR SDRAM/SGRAM of claim 4, wherein the logic circuitry comprises an Extended Mode Register upon which to receive the predetermined command.

7. The DDR SDRAM/SGRAM of claim 1, wherein the memory devices has a plurality of characteristics that vary according to operation in the first mode compared to operation in the second mode.

8. The DDR SDRAM/SGRAM of claim 7, wherein the plurality of characteristics includes at least one characteristic selected from the group essentially consisting of: DLL, CAS latencies, preambles, postambles, set-up timing and hold timing.

9. A graphics card comprising:

a processor; and, a dual-data rate (DDR) synchronous dynamic random access memory (SDRAM)/synchronous graphic random access memory (SGRAM) coupled to the processor and configurable to operation in a first mode and a second mode, wherein the first mode enables control of a bidirectional strobe output with a delay locked loop (DDL)/phase locked loop (PLL) circuit and the second mode disables control of the bidirectional strobe output from the delay locked loop (DLL)/phase locked loop (PLL) circuit and allows data to be input/output from dual-data rate (DDR) synchronous dynamic random access memory (SDRAM)/synchronous graphic random access memory (SGRAM).

10. The graphics card of claim 9, wherein the DLL/PLL of the first mode provides for alignment of output data of the DDR SDRAM/SGRAM with an incoming clock signal.

11. The graphics card of claim 9, wherein the DDR SDRAM/SGRAM defaults to the second mode, and enters the first mode upon receiving a Load Mode Register command.

12. The graphics card of claim 11, wherein the DDR SDRAM/SGRAM comprises an Extended Mode Register upon which to receive the Load Mode Register command.

13. The graphics card of claim 9, wherein the DDR SDRAM/SGRAM has a plurality of characteristics that vary according to operation in the first mode compared to operation in the second mode, the plurality of characteristics including at least one characteristic selected from the group essentially consisting of: DLL, CAS latencies, preambles, postambles, set-up timing and hold timing.

14. A computer comprising:
a processor;
a memory coupled to the processor; and,
a graphics subsystem coupled to the processor and comprising a dual-data rate (DDR) synchronous dynamic random access memory (SDRAM)/synchronous graphic random access memory (SGRAM) coupled to the processor and configurable to operation in a first mode and a second mode,
wherein the first mode enables control of a bidirectional strobe output with a delay locked loop (DLL)/phase locked loop (PLL) circuit and the second mode disables control of the bidirectional strobe output from the delay locked loop (DLL)/phase locked loop (PLL) circuit and allows data to be input/output from the graphics subsytem.

15. The computer of claim 14, wherein the DLL/PLL circuit of the first mode provides for alignment of output data of the DDR SDRAM/SGRAM with an incoming clock signal.

16. The computer of claim 14, wherein the DDR SDRAM/SGRAM defaults to the second mode, and enters the first mode upon receiving a Load Mode Register command on an Extended Mode Register of the DDR SDRAM/SGRAM.

17. The computer of claim 14, wherein the DDR SDRAM/SGRAM has a plurality of characteristics that vary according to operation in the first mode compared to operation in the second mode, the plurality of characteristics including at least one characteristic selected from the group essentially consisting of: DLL, CAS latencies, preambles, postambles, set-up timing and hold timing.

18. A method comprising:
defaulting a device dual-data rate (DDR) synchronous dynamic random access memory (SDRAM)/synchronous graphic random access memory (SGRAM) configurable to operate in a first mode and to operate in a second mode, wherein the first mode and the second mode allow data to input or output;
receiving a predetermined command to switch the operation of the DDR SDRAM/SGRAM to the first mode; and,
switching the operation of the DDR SDRAM/SGRAM to the first mode from the second mode upon receiving the predetermined command wherein the first mode enables control of a bidirectional strobe output with a delay locked loop (DLL)/phase locked loop (PLL) circuit and the second mode disables control of the bidirectional strobe output from the delay locked loop (DLL)/phase locked loop (PLL) circuit.

19. The method of claim 18, wherein defaulting the DDR SDRAM/SGRAM comprises defaulting the DDR SDRAM/SGRAM configurable to operate in the first mode.

20. The method of claim 18, wherein receiving the predetermined command comprises receiving a Load Mode Register command on an Extended Mode Register of the DDR SDRAM/SGRAM.

21. A method comprising:
defaulting a dual-data rate (DDR) synchronous dynamic random access memory (SDRAM)/synchronous graphic random access memory (SGRAM) configurable to operation in a first mode including a delayed lock loop (DLL) capability and a second mode including a non-DLL capability to operation in the second mode, wherein operation in the first mode or the second mode allows data to input or output;
receiving a predetermined command to switch the operation of the DDR SDRAM/SGRAM to the first mode; and,
switching the operation of the DDR SDRAM/SGRAM to the first mode from the second mode upon receiving the predetermined command wherein the first mode enables control of a bidirectional strobe output with a delay locked loop (DLL)/phase locked loop (PLL) circuit and the second mode disables control of the bidirectional strobe output from the delay locked loop (DLL)/phase locked loop (PLL) circuit.

22. The method of claim 21, wherein receiving the predetermined command comprises receiving a Load Mode Register command on an Extended Mode Register of the DDR SDRAM/SGRAM.

23. A system comprising:
a processor; and,
a dual-data rate (DDR) memory having a memory device configurable to operate in a first mode and a second mode, the first mode and the second mode each relating to a different alignment of output data as to a read line of the memory wherein the first mode enables control of a bidirectional strobe output with a delay locked loop (DLL)/phase locked loop (PLL) circuit and the second mode disables control of the bidirectional strobe output from the delay locked loop (DLL)/phase locked loop (PLL) circuit.

24. The system of claim 23, wherein the DDR memory comprises a synchronous dynamic random access memory (SDRAM)/synchronous graphic random access memory.

25. The system of claim 23, wherein the system has a functionality selected from the group essentially consisting of: television set-top box, and high-definition television set.

26. A dual-data rate synchronous dynamic random access memory, comprising:
a memory array; and,
a control circuit coupled between the memory array and a bidirectional strobe and operable in a first mode to enable delay locked loop control of the bidirectional strobe and operable in a default mode to disable delay locked loop control of the bidirectional strobe, wherein the first mode and the default mode each allow data to align at a data line in the memory array.

27. A dual-data rate synchronous dynamic random access memory, comprising:

a memory array; and a control circuit coupled between the memory array and a bidirectional strobe and operable in a first mode to enable phase locked loop control of the bidirectional strobe and operable in a default mode to disable phase locked loop control of the bidirectional strobe, wherein the memory array operates in the first mode or the second mode.

28. A dual-data rate synchronous dynamic random access memory, comprising:

a memory array; and a control circuit coupled between the memory array and a bidirectional strobe and operable in a JEDEC mode to enable delay locked loop control of the bidirectional strobe and operable in a non-JEDEC mode to disable delay locked loop control of the bidirectional strobe, wherein the memory array operates in the first mode or the second mode.

29. A dual-data rate synchronous dynamic random access memory, comprising:

a memory array; and, a control circuit coupled between the memory array and a bidirectional strobe and operable in a JEDEC mode to enable phase locked loop control of the bidirectional strobe and operable in a non-JEDEC mode to disable phase locked loop control of the bidirectional strobe, wherein the memory array operates in the first mode or the second mode.

\* \* \* \* \*